(12) United States Patent
Finders (10) Patent No.: US 7,824,842 B2
(45) Date of Patent: Nov. 2, 2010

(54) METHOD OF PATTERNING A POSITIVE TONE RESIST LAYER OVERLAYING A LITHOGRAPHIC SUBSTRATE

(75) Inventor: Jozef Maria Finders, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 1269 days.

(21) Appl. No.: 11/243,190

(22) Filed: Oct. 5, 2005

(65) Prior Publication Data

US 2007/0077523 A1      Apr. 5, 2007

(51) Int. Cl.
    *H01L 21/00*    (2006.01)
    *G03C 5/00*     (2006.01)

(52) U.S. Cl. .................. 430/313; 430/311; 430/314; 430/330

(58) Field of Classification Search .......... None
    See application file for complete search history.

(56) References Cited

U.S. PATENT DOCUMENTS

| | | | |
|---|---|---|---|
| 5,546,225 A | 8/1996 | Shiraishi | |
| 6,042,998 A | 3/2000 | Brueck et al. | |
| 6,569,605 B1 | 5/2003 | Bae | 430/316 |
| 6,573,975 B2 * | 6/2003 | Govil et al. | 355/52 |
| 2002/0150841 A1 | 10/2002 | Wang et al. | |
| 2003/0076423 A1 * | 4/2003 | Dolgoff | 348/222.1 |
| 2005/0069814 A1 | 3/2005 | Endo et al. | |
| 2005/0255696 A1 | 11/2005 | Makiyama et al. | |

FOREIGN PATENT DOCUMENTS

| | | |
|---|---|---|
| JP | 06-123962 A | 5/1994 |
| JP | 06-138643 A | 5/1994 |
| JP | 2005-107226 A | 4/2005 |
| JP | 2005-148597 A | 6/2005 |
| WO | 2004/100235 | 11/2004 |

OTHER PUBLICATIONS

Neisser et al., Simulation and Experimental Evaluation of Double Exposure Techniques, IBM Microelectronics, 372/SPIE vol. 3334, pp. 372-373, Feb. 1998.
Yen et al., Low-K, Optical Lithography for 100 nm Logic Technology and Beyond, J. Vac. Sci. Technol. B 19(6), Nov./Dec. 2001, pp. 2329-2334.
European Search Report issued for European Patent Application No. 06255143.7-2222, dated Feb. 19, 2007.
Maenhoudt, et al., "Double Patterning Scheme for sub-0.25 k1 Single Damascene Structures at NA=0.75, λ=193nm," Optical Microlithography XVIII, Proceedings of SPIE vol. 5754, 2005, pp. 1508-1518, May 2005.
Ebihara, et al., "Beyond $K_1$=0.25 Lithography: 70nm L/S Patterning Using KrF Scanners," Proceedings of SPIE vol. 5256, 2003, pp. 985-994, Dec. 17, 2003.
Fu et al., "Maximization of Process Windows for Low-k1 Spaces Using KrF Lithography," Proceedings of SPIE, vol. 5040, 2003, pp. 955-966, Feb. 2003.
Yan, et al., "Sub-Micron Low-$k_1$ Imaging Characteristics Using a DUV Printing Tool and Binary Masks," Proceedings of SPIE, vol. 2440, pp. 270-277, May 1995.
English translation of Office Action dated Aug. 18, 2010 of Japanese patent application No. 2006-266438.

* cited by examiner

*Primary Examiner*—Daborah Chacko Davis
(74) *Attorney, Agent, or Firm*—Pillsbury Winthrop Shaw Pittman LLP (57) ABSTRACT

A single exposure method and a double exposure method for reducing mask error factor and for enhancing lithographic printing-process resolution is presented. The invention comprises decomposing a desired pattern of dense lines and spaces in two sub patterns of semi dense spaces that are printed in interlaced position with respect to each other, using positive tone resist. Each of the exposures is executed after applying a relative space-width widening to the spaces of two corresponding mask patterns of semi dense spaces. A factor representative for the space-width widening has a value between 1 and 3, thereby reducing mask error factor and line edge roughness.

20 Claims, 5 Drawing Sheets

METHOD OF PATTERNING A POSITIVE TONE RESIST LAYER OVERLAYING A LITHOGRAPHIC SUBSTRATE

BACKGROUND

1. Field of the Invention

The present invention generally relates to photolithography and associated methods for exposing semiconductor substrates.

2. Description of Related Art

Lithographic exposure apparatuses can be used, for example, in the manufacture of integrated circuits (ICs). In such a case, a patterning device may generate a circuit pattern corresponding to an individual layer of the IC. In photolithography, a beam of radiation is patterned by having that beam traverse the patterning device, and is projected by a projection system of the lithographic apparatus onto a target portion (e.g., comprising one or more dies) on a substrate (silicon wafer) that has been coated with a layer of photo-activated resist (i.e., photoresist) material, such as to image the desired pattern in the resist. In general, a single wafer will contain a whole network of adjacent target portions that are successively irradiated via the projection system, one at a time.

In the semiconductor industry, the continual demand for smaller semiconductor devices, having smaller patterns and features on the wafer substrate, is pushing the limits on the optical resolution that can be achieved by lithographic exposure apparatus.

Generally, the smallest size of a repeatable feature (e.g., "half-pitch") of a pattern exposed on the wafer substrate that can be optically resolved by lithographic exposure apparatus, depends on attributes of the projection system and the (patterned) projection beam of radiation. In particular, the optical resolution for half-pitch feature size may be derived by using the simplified form of the Rayleigh resolution equation:

$$p_{0.5} = k_1 \cdot \lambda / NA, \text{ with } k_1 \geq 0.25 \quad (1)$$

where: $p_{0.5}$ represents the repeatable feature size (e.g., "half-pitch") in nm;

NA represents the numerical aperture of projection system;

$\lambda$ represents the wavelength of projection beam, in nm; and $k_1$, is a factor representative for the achievable optical resolution limit for the half-pitch feature size.

As indicated above, the theoretical optical resolution half-pitch lower limit for $k_1$, is 0.25. In an attempt to approach the $k_1 = 0.25$ barrier, considerable efforts have been directed to develop expensive technologies that are capable of employing shorter wavelengths and/or higher numerical apertures, thus allowing production of smaller features approaching the $k_1 \geq 0.25$ constraint.

Fabrication of an integrated circuit pattern involves the control of space tolerances between features, as well as control of feature dimension tolerances. In particular the control of tolerances of the smallest dimensions such as for example the sizes of contacts or the width of lines or of spaces between lines permitted in the fabrication of the integrated circuit device is of importance. The size of these most critical dimensions is referred to as the critical dimension ("CD"). Features comprising a minimum size substantially equal to the CD are referred to as "CD-sized features" in the present text.

Further, a variety of phenomena that accompany low k1 imaging, such as line-end retraction, corner rounding, variation of CD versus pitch, mask error factor ("MEF"), and line-edge roughness ("LER") may lead to a loss of feature fidelity beyond tolerance. In particular, MEF contributes to variations in lengths of polysilicon gates, reducing performance of the integrated circuit. The MEF is defined as the ratio of a change in CD of CD-sized features in resist in response to a change of the corresponding size of the corresponding features on the mask, whereby the latter size is normalized to substrate level taking into account the demagnification of the projection system. In the field of photolithography, Mask Error Factor is, alternatively, also referred to as Mask Error Enhancement Factor ("MEEF"). The two concepts are identical, and in the present text referred to as Mask Error Factor or MEF.

Lithographic apparatus as mentioned above typically include a radiation system and a projection system. The radiation system generally includes an illumination system. The illumination system receives radiation from a source, such as a laser, and produces an illumination beam for illuminating an object, such as the patterning device (e.g., a mask on a mask table). Within a typical illumination system, the beam is shaped and controlled such that at a pupil plane of the illumination system the beam has a desired spatial intensity distribution. Such a spatial intensity distribution at the pupil plane effectively acts as a virtual radiation source for producing the illumination beam. Various shapes of said intensity distribution, consisting of (substantially uniform) light areas on a dark background, can be used. Any such shape will be referred to hereinafter as an "illumination mode". Known illumination modes include: conventional (a top-hat shaped intensity distribution in said pupil), annular, dipole, quadrupole and more complex shaped arrangements of the illumination pupil intensity distribution. A lateral position in said pupil plane corresponds to an angle of incidence at the patterning device, and any such angle of incidence is commonly expressed as a fraction sigma ($\sigma$) of a numerical aperture NA of the projection system. Therefore, a more complete characterization of the intensity distribution in a pupil of the illumination system involves, besides an indication of the illumination mode, also an indication of parameters of the illumination mode, such as, for example, $\sigma$ and NA. A combination of an illumination mode and corresponding parameters of said illumination mode is referred to hereinafter as an "illumination setting". Known illumination settings include: a "conventional" illumination setting (whereby the intensity distribution in an illumination pupil is substantially uniform up to a certain radius defined by a parameter value of $\sigma$, where $0 < \sigma < 1$, and a parameter value of the numerical aperture NA of the projection system), an annular setting, a dipole setting, a quadrupole setting and more complex arrangements. An annular or a multipole setting are typically characterized by the parameters $\sigma_{inner}$ and $\sigma_{outer}$ respectively indicating an inner and outer radial extent of an annulus or of poles. Such illumination modes are providing off-axis illumination of a patterning device. Illumination settings may be formed in various ways. The $\sigma$ value of a conventional illumination mode can be controlled using a zoom lens while σinner and σouter values of an annular mode can be controlled using a zoom-axicon. The NA value can be controlled using a settable iris diaphragm in the projection system.

More complex settings (such as said dipole and quadrupole modes) may be formed using a diaphragm with appropriate apertures in the pupil plane or by a diffractive optical element. Typically, said diffractive optical element is arranged to generate a preselected angular intensity distribution upstream of a pupil plane of the illumination system. This angular intensity distribution is transformed into a corresponding spatial intensity distribution in the pupil plane of the illumination system.

In particular at high numerical aperture (NA>0.85) and using off axis illumination modes for illumination the patterning device, MEF and LER are most prominent errors limiting a further reduction of $k_1$ for those lithographic processes whereby the task is to print in positive tone resist semi-dense regularly spaced patterns of trenches or lines, the width sized at critical dimension and the features spaced apart about three times the critical dimension.

SUMMARY

Embodiments of the present invention ameliorate a lithographic exposure process for patterning a positive tone resist layer. A method consistent with the principles of the present invention, as embodied and broadly described herein, provide for the enhancement of image resolution in a lithographic system.

There is provided a method of patterning a positive tone resist layer overlaying at least partially a lithographic substrate with a target pattern of target pattern lines and spaces having a target duty cycle of line-width divided by pitch, including providing a mask pattern of mask-pattern lines and spaces in accordance with the target pattern using a patterning device, and having a mask-pattern duty cycle of line-width divided by pitch, and exposing the resist layer to a pattern of radiation, whereby the patterning device and a projection system having a demagnification factor are traversed by the radiation and are arranged and constructed to provide said pattern of radiation, whereby the method further includes selecting a bias-ratio of mask-pattern line-width multiplied by demagnification and divided by target-pattern line width at a value lower than 0.8, and arranging an exposure dose in accordance with the selected bias-ratio to provide the target duty cycle.

According to an aspect of the invention there is provided a double-exposure method for exposing a lithographic substrate including the steps described above and further comprising developing the resist layer, etching a hard mask layer underneath the positive tone resist layer to transfer the target pattern to the hard mask layer, providing a supplementary positive tone resist layer overlaying at least partially the hard mask layer, and patterning the supplementary resist layer by again executing the steps described in the paragraph above, whereby the mask pattern, the target pattern, the patterning device, the pattern duty cycle, the bias-ratio, the pattern of radiation, and the exposure dose are a respective supplementary mask pattern, target pattern, patterning device, pattern duty cycle, bias-ratio, pattern of radiation, and exposure dose, and whereby the spaces of the supplementary target pattern of lines and spaces are disposed in interlaced position with respect to the spaces of the target pattern.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

As noted above, there exists a constant need to achieve finer optical resolutions thereby approaching the theoretical half-pitch lower limit $k_1$ of 0.25, for example for printing dense or semi dense patterns of lines and spaces. Besides enhancing the resolution of the lithographic patterning process, there is a need to maintain feature fidelity. The mask pattern is in principle similar to the target pattern. However, during the manufacturing of a mask pattern, for example embodied as a quartz substrate provided with a pattern of features of chromium by means of electron beam writing, residual pattern-writing errors may occur. Such errors are by the lithographic process transferred in to the target pattern, and the sensitivity of a lithographic process to such pattern errors is expressed by a so called mask error factor. A reduction of mask error factor would provide an important advantage.

As noted above the phenomenon of mask error factor (MEF) accompanying low $k_1$ imaging, may lead to a loss of feature fidelity beyond tolerance. The MEF is defined as the ratio of a change $\Delta RS$ of a feature width RS in resist, in response to a change $\Delta PS$ of a corresponding size PS of the corresponding features on the mask, whereby the latter size PS is normalized to substrate level taking into account the demagnification M of the projection system (the magnitude of M may for example be ¼, ⅕ or ⅛):

$$MEF = \Delta RS/(\Delta PS \cdot M) \qquad (2)$$

For simplicity, in the present text and formula's the scaling factor M is or may not be mentioned, but is assumed to be accounted for when discussing dimensions at mask level. In the presence of a mask error factor the feature fidelity as provided by the imaging process using the projection system in combination with the imaging properties of the exposed resist may become affected such as to become beyond tolerance.

To illustrate the occurrence of MEF, a process is considered whereby a line and space pattern is to be printed in positive tone resist, and whereby the critical dimension CD of the spaces is 25 nm and the pitch P of the spaces is be 100 nm. Thus, the lines have a width of 75 nm, i.e., three times the critical dimension CD. The exposure process may for example be executed using an attenuated Phase Shift Mask (att-PSM). With such a mask, the lines are embodied as phase shifting, radiation absorbing lines (but passing a small percentage of the radiation), for example of molybdenum silicide (MoSi), with a width of three times the critical dimension CD, i.e., 75 nm, on a quartz substrate.

A line space pattern as described here can be further characterized by a target duty cycle TDC of line-width divided by pitch, referring to the dimensions of the features in the patterned resist-layer, and a pattern duty cycle PDC of line-width divided by pitch, referring to the dimensions of the features at mask level. For the present process, TDC=75 [nm]/100 [nm]=0.75 and

PDC=75 [nm]/100 [nm]=0.75.

The duty cycles TDC and PDC equal.

To further characterize the lithographic patterning process, a third ratio, referred to as a bias-ratio BR, is defined as the ratio of the pattern line width (scaled by the demagnification of the projection system) to the line width of the lines of the target pattern, i.e., BR is defined as

BR=PDC/TDC, and for the present process BR=1.

Generally additional size deviations of mask-pattern features are introduced to compensate, for example, effects of errors occurring during projection and exposure of a pattern. Such a re-sizing of features of the mask-pattern is referred to as biasing. An amount of biasing is commonly expressed in terms of a corresponding, nominal amount of re-sizing at substrate level. Typically, such biasing of mask-pattern features involves relative size deviations with respect to nominal size up to 20%. A biasing leads a pattern duty cycle PDC which slightly deviates from the target duty cycle TDC. For example, when in the process described above the width of the spaces is increased by a factor 1.2, whilst the pitch of the spaces is kept at 100 nm, the pattern duty cycle PDC is 0.7 and the bias ratio BR is 0.93. Deviations from unity of the bias-ratio BR are limited, however, to about +or −0.1, since the relative magnitude of mask-pattern feature biasing, as known from prior art, is limited to about 20%.

Figure 1:
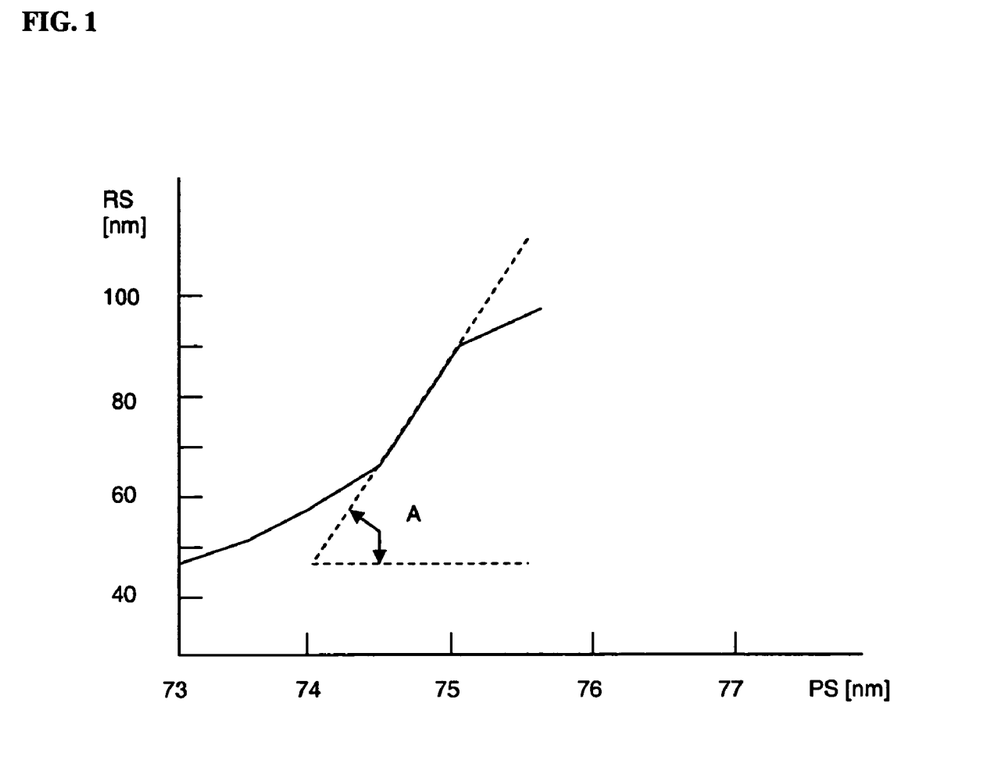
FIG. 1 illustrates a magnitude of mask error factor for a lithographic patterning process. The horizontal axis indicates a width of lines of a mask pattern, and the vertical axis indicates a width of lines as patterned in resist.

An example of the magnitude of the MEF, and typical for a process with a bias ratio BR between 0.9 and 1.1, is illustrated in FIG. 1. In FIG. 1, the horizontal axis indicates the width PS of the lines of the mask pattern, and the vertical axis indicates the resulting width RS of the lines as patterned in resist. The tangent of the slope-angle A of the plot of the width RS versus the width PS in FIG. 1 is representing the mask error factor for the present lithographic process. The process is further characterized by a resist model which was calibrated for a NA of 0.93, a layer resist thickness of 50 nm, and a dipole TE polarized illumination mode with $\sigma_{inner}$=0.82 and $\sigma_{outer}$=0.96. The value of MEF varies strongly with the width of the mask-pattern feature and is of the order of 10.

According to a first embodiment of the present invention, the MEF of this process can be substantially reduced by selecting a value of the bias-ratio BR which is substantially lower than is known from the prior art addressing the problem of mask-pattern feature biasing. For example, in the present embodiment the bias-ratio is chosen to be lower than 0.8. In the present embodiment the bias-ratio is chosen to be 0.67. This implies that both the lines and the spaces at the mask are embodied as lines and spaces of 50 nm width.

Figure 2:
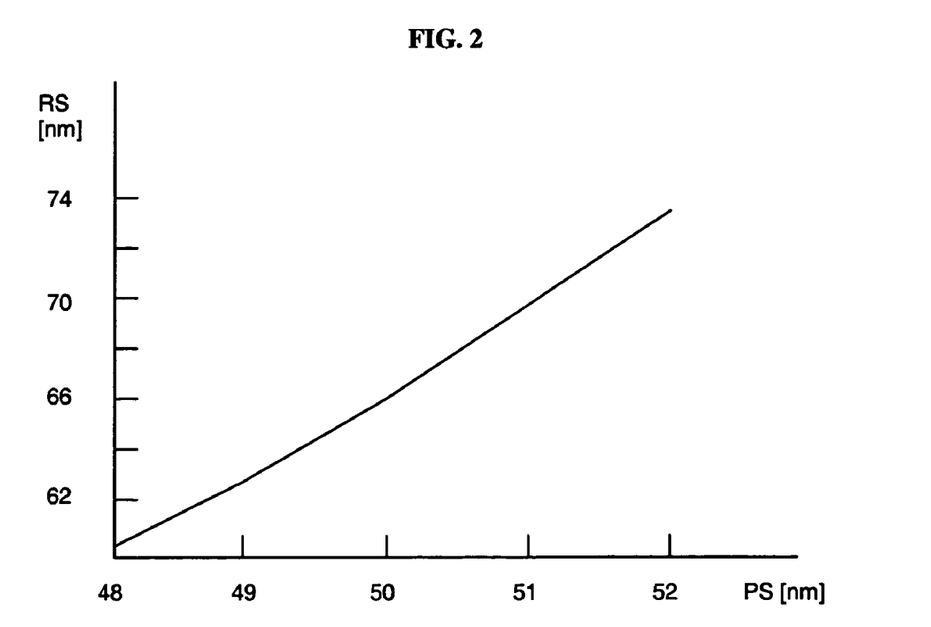
FIG. 2 illustrates a magnitude of mask error factor for a lithographic patterning process according to the present invention.

FIG. 2 illustrates the resulting sensitivity to mask pattern errors under the same conditions as described above, safe that now TDC=75 [nm]/100 [nm]=0.75, PDC=50 [nm]/100 [nm]=0.5, and

BR=PDC/TDC=0.67.

The MEF is reduced to a value in a range between 2.9 and 3.8.

In the present embodiment, the required target duty cycle TDC=0.75 is obtained by adjusting the exposure dose to compensate for the pattern duty cycle PDC being set at 0.5 instead of 0.75. Such an adjustment of exposure dose causes an adjustment of the exposure dose within exposed areas of the pattern of the radiation at substrate level. For analysis purposes, this pattern can be considered as an image in air, as provided by the projection system. In the present embodiment, the contrast of the aerial image is much larger than the contrast of the aerial image in the conventional process, described above, whereby TDC=0.75 and 0.9<BR<1.1. Therefore, a lowering of exposure dose with respect to the exposure dose in the prior art process can be exploited to broaden areas of the aerial image wherein exposure dose is below energy-to-clear. Here, the concept of "energy-to-clear" is related to a change of solubility from insoluble to soluble in a positive tone resist (and from soluble to insoluble in a negative tone resist) which occurs at a threshold value of the exposure dose, the so-called energy-to-clear. The reduction of MEF as obtained according to the present invention, also leads to a reduction of LER, since a line edge roughness error in the processed target pattern is dependent on a line edge roughness of the lines comprised in the mask pattern.

A second embodiment is the same as the first embodiment, safe that the target duty cycle differs from 0.75. The advantages of the method according to the invention and as described in the first embodiment are substantially the same for semi dense target patterns of lines and spaces whereby for example the lines have a line width in the range of 70 nm to 80 nm, and whereby the pitch of the lines and spaces is 100 nm. Thus, the value of target duty cycle TDC may, in accordance with the present invention, be selected from a range of values 0.7 to 0.8. According to an aspect of the invention, this range of target pattern line widths may be provided using mask pattern line widths in the range of 20 nm to 55 nm at a pitch of 100 nm (ignoring the scale factor M) in combination with an adjustment of the exposure dose to maintain any of the selected target pattern duty cycles, i.e., with the pattern duty cycle PDC having a value in the range 0.2 to 0.55. With pattern line widths in the range of 20 nm to 55 nm at a pitch of 100 nm the bias ratio BR has, in the present embodiment, a lowest value of 0.25 and a highest value of 0.78, i.e., below 0.8 (and hence below bias ratios known from prior art).

According to the invention the concept of a "space" comprised by a pattern of lines and spaces in resist is not limited to a space as obtained after development of the resist. The advantages of the invention are obtained irrespective of lithographic processing after exposure, such as for example a post exposure bake and a development of the resist.

Consequently, in a third embodiment, which is the same as the first and or second embodiment, the lines of the target pattern are lines of unexposed positive tone resist material, and the spaces of the target pattern are embodied as portions of photo activated positive tone resist material, where these portions are shaped in accordance with the spaces of the target pattern.

A further reduction of MEF is provided in a fourth embodiment of the invention, which is the same as the first embodiment safe that the pattern duty cycle PDC is PDC=0.25 (pattern lines of 25 nm and pattern spaces of 75 nm) and the target duty cycle TDC=0.5 (target pattern lines of 50 nm width and target pattern spaces of 50 nm with). The bias ratio BR is 0.5, and the obtainable MEF is 2.

As noted above, there exists a constant need to achieve finer optical resolutions. According to the present invention it is possible to circumventing the theoretical half-pitch lower limit $k_1$ of 0.25 for printing dense lines using a double exposure process and exploiting the advantages of the single exposure embodiments described above.

As described in greater detail below, the present invention achieves resolutions lower than the half-pitch lower limit half pitch $P_{0.5}=k_1 \cdot \lambda/NA$ whereby $k_1 \geqq 0.25$, thus circumvention the $k_1 =0.25$ barrier, by implementing a dual exposure technique whereby either a Post Exposure Bake (also referred to as "PEB") is applied between the two exposures and a development of the resist after the first and preceding the second exposure is not applied, or a PEB is applied and followed by a development of the resist and an etching of a hard mask underneath the resist layer.

According to an aspect of the invention the lithographic patterning process involves the exclusive use of positive tone resist for printing features whereby $k_1<0.25$. The use of positive tone resist is preferable over the use of negative tone resist for lithographic printing of features such as, for example, dense, semi dense and/or isolated lines.

In the manufacture of integrated circuits (ICs) lithographic exposure apparatuses are used, in which case a patterning device such as a mask (a "reticle") generates a circuit pattern corresponding to an individual layer of the IC. In photolithography, a beam of radiation is patterned by having that beam traverse the reticle. Subsequently, the patterned radiation beam is projected by a projection system of the lithographic apparatus onto a target portion (e.g., comprising one or more dies) on a substrate (such as, for example, a silicon wafer) that has been coated with a layer of photoresist material. An image of the desired pattern is formed by the projection system, and the resist material is exposed to patterned radiation constituting said image. In general, a single wafer will contain a whole network of adjacent target portions that are successively irradiated via the projection system, one at a time.

According to an aspect of the invention, the method of patterning a resist layer is applied twice in a double exposure lithographic process. The invention comprises decomposing a desired pattern of dense lines and spaces into two sub patterns of semi dense spaces that are printed in interlaced position with respect to each other, using positive tone resist for each exposure. Each of the exposures is executed after applying a relative space-width widening to the spaces of two corresponding mask patterns of semi dense spaces, whereby a factor representative for the space-width widening has a value between 1 and 3, thereby reducing mask error factor and line edge roughness. Embodiments presented below describe this aspect of the invention in more detail.

Figure 3:
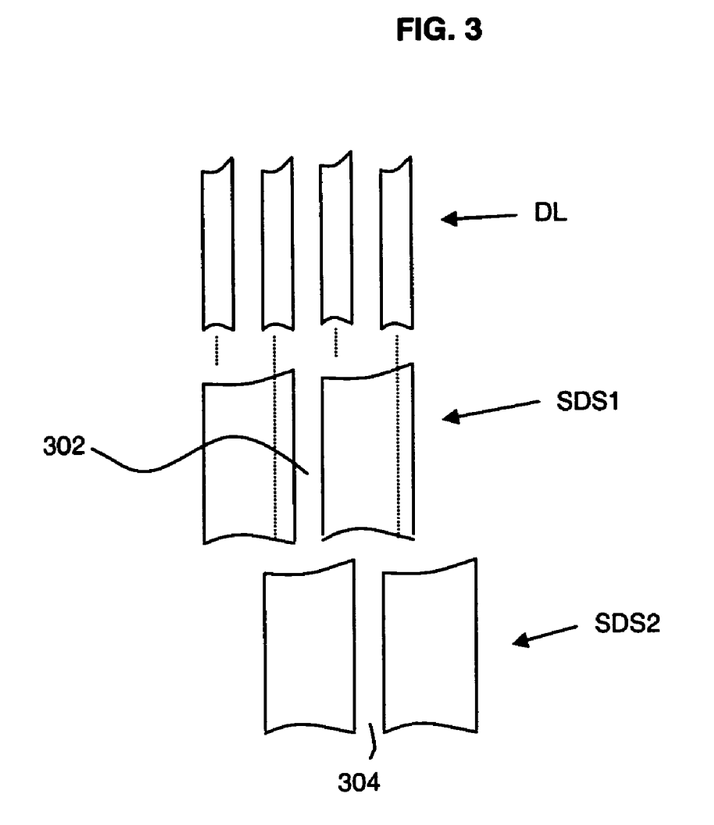
FIG. 3 illustrates a decomposition of a desired pattern of dense lines and spaces into two patterns of semi dense spaces.

According to a fifth embodiment of the present invention, there is provided a double exposure method of patterning a material layer, at least partially overlaying a lithographic substrate, with a desired dense pattern of spaces and lines DL, as schematically indicated in FIG. 3. The method comprises two successive positive tone resist layer patternings, whereby the spaces 302 and 304 of two respective target patterns, a target pattern SDS1 and a supplementary target pattern SDS2, are positioned in interlaced position with respect to each other. The patterns SDS1 and SDS2 are transferred to the material layer to provide the desired pattern DL.

Figure 4:
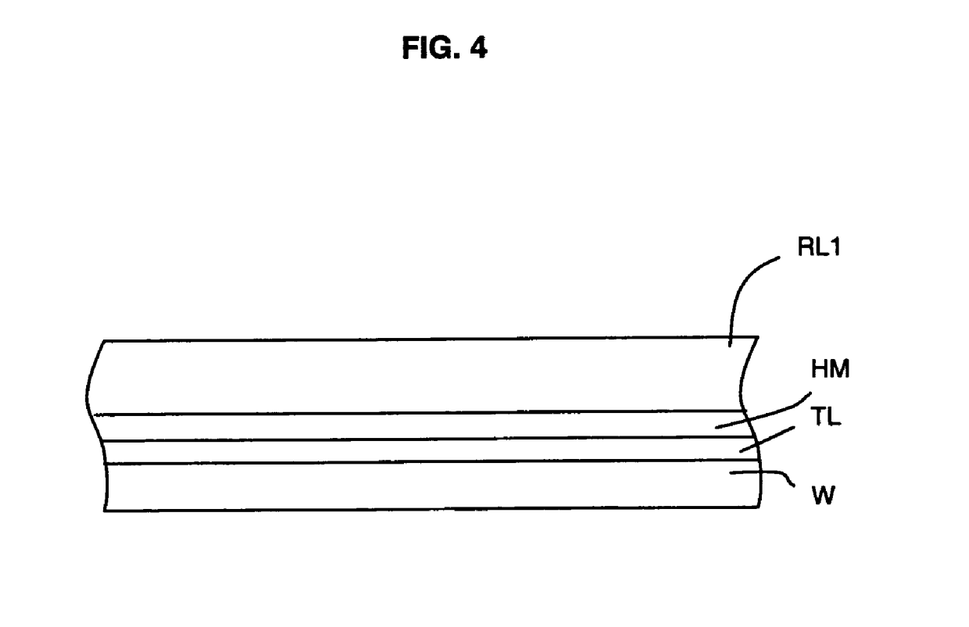
FIG. 4 illustrates a lithographic substrate provided with a hard mask and a resist layer.

In the present embodiment, and as illustrated in FIG. 4, the substrate W, which may carry previously processed IC layers, is provided with a target layer TL, a hard mask layer HM on top of the target layer TL, and a positive tone resist layer RL1 on top of the hard mask layer HM.

The first patterning with a target pattern SDS1 having a target duty cycle TDC1, includes providing a mask pattern MP1 in accordance with the target pattern SDS1, and having a pattern duty cycle PDC1 a bias-ratio BR1=PDC1/TDC1. To exploit the advantage of low MEF, the bias-ratio BRI is chosen lower than 0.8.

In the present embodiment, the successive exposure conditions are the same as in the first embodiment. For example, the target duty cycle TDC1 of the target pattern SDS1 is TDC1=0.75, and the pattern duty cycle PDC1 of the mask pattern MP1 is PDC1=0.5, so that the bias-ratio is BR1=0.67. Similarly, the second exposure is executed using a supplementary mask pattern MP2 having a corresponding supplementary pattern duty cycle PDC2 with PDC2=0.5, to provide the supplementary target pattern SDS2 having a supplementary target duty cycle TDC2 with TDC2=0.75. Consequently, a corresponding supplementary bias ratio BR2 is given by BR2=0.67.

Figure 5A:
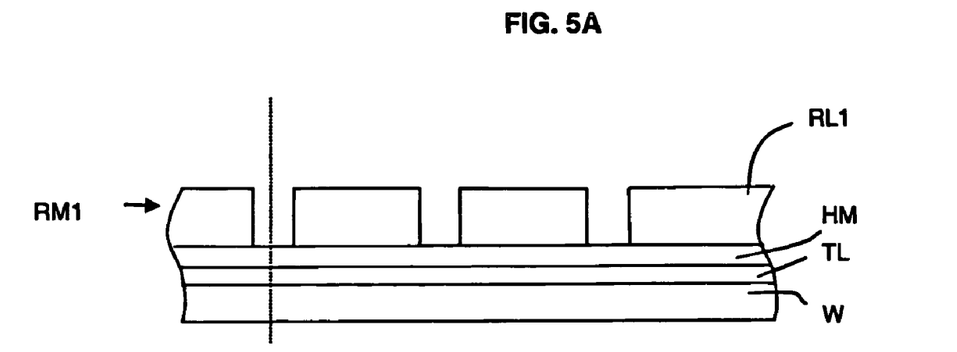
FIG. 5 illustrates consecutive results of a double exposure patterning method according to the present invention including the effect of the first exposure and a first etching of the hard mask.
Figure 5B:
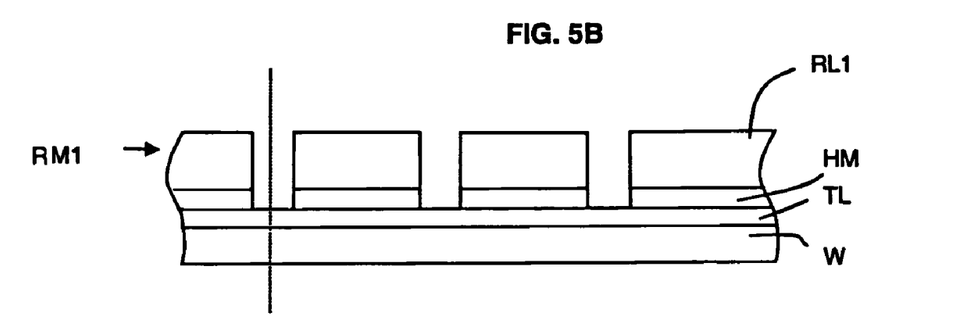
Figure 5C:
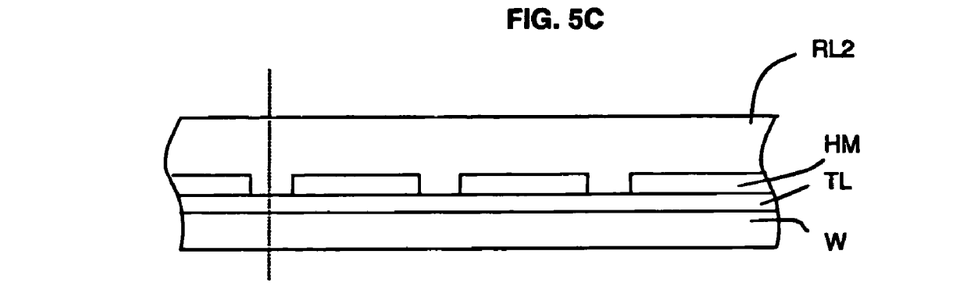

The resist layer RL1 is exposed to a pattern of the radiation using the mask pattern MP1 and the projection system which are arranged to image the mask pattern onto the resist layer. The exposure dose is adjusted to arrive at the target duty cycle TDC1 as specified for the pattern SDS1. The first patterning is followed by developing the resist layer RL1 to provide an etch mask RM1 of resist material, as illustrated in FIG. 5A. Next the hard mask layer HM is dry etched to transfer the target pattern to the hard mask layer, as illustrated in FIG. 5B. The resist mask RM1 is stripped, and a supplementary positive tone resist layer RL2 is applied to the hard mask layer HM, as illustrated in FIG. 5C.

Figure 5D:
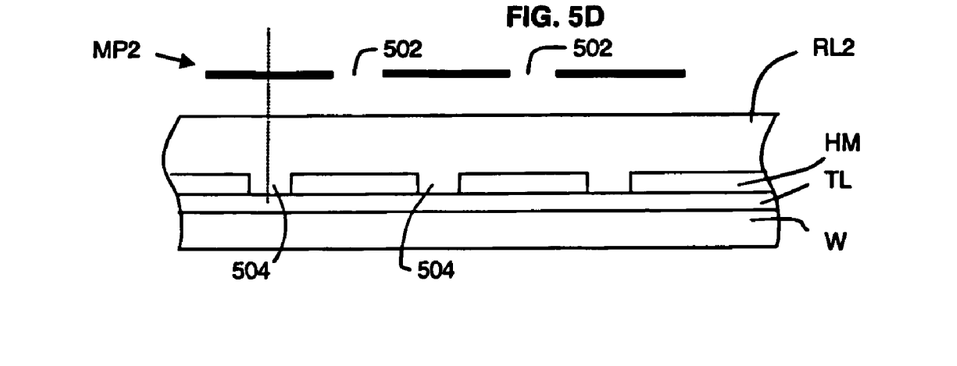

Then, the second, "supplementary" exposure is executed, as described above, whereby the mask MP2 is positioned such that the spaces 304 of the target pattern SDS2 will be disposed in interlaced position with respect to the spaces of the pattern SDS1. This can be realized by arranging the spaces 502 of the mask MP2 in interlaced position with respect to the spaces 504 of the previously etched hard mask HM, as illustrated in FIG. 5D.

As with the first exposure, the advantage of low MEF is obtained by the choice of pattern ratio and in particular of bias ratio BR2 lower than 0.8, and by arranging the exposure dose in accordance with the selected bias-ratio BR2 to obtain the target duty cycle TDC2 as specified for the pattern SDS2.

Figure 6A:
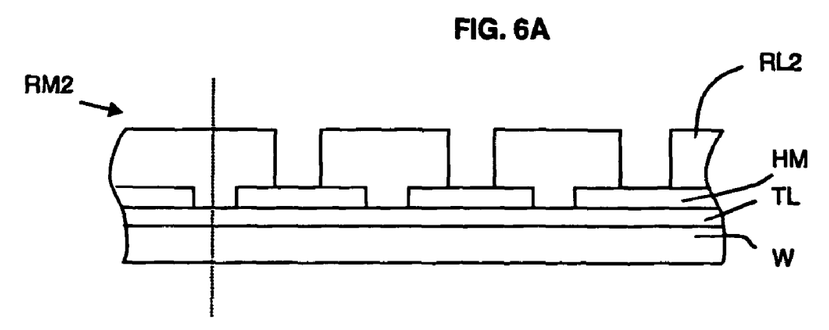
FIG. 6 illustrates the results of a double exposure patterning method according to the present invention including the effect of the second exposure and a second etching of the hard mask.
Figure 6B:
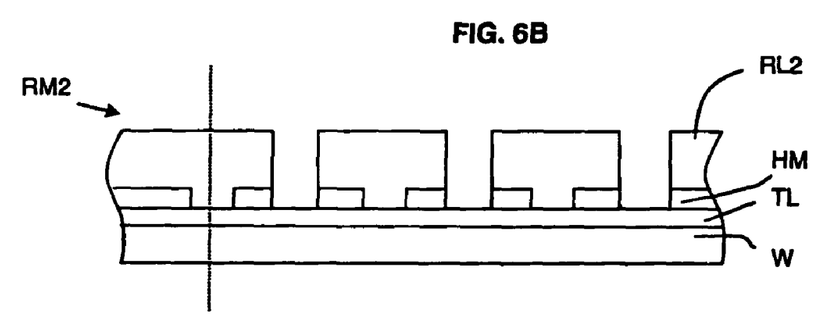
Figure 6C:
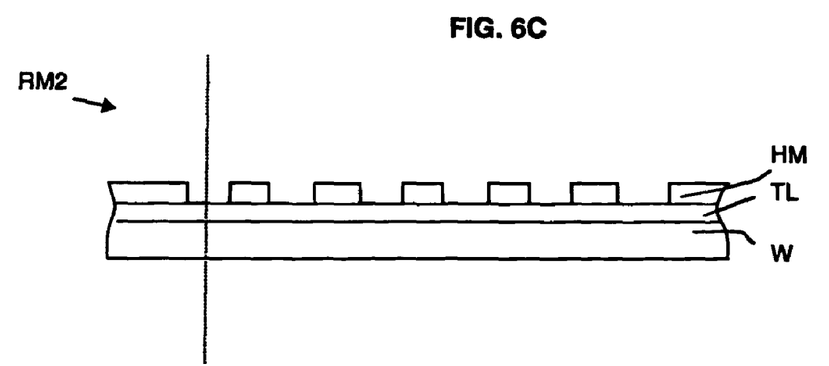

A subsequent development of the exposed resist layer RL2 provides an etch mask RM2 of resist material, as illustrated in FIG. 6A. Next the hard mask layer HM is again dry etched to transfer the target pattern SDS2 to the hard mask layer, as illustrated in FIG. 6B. The resist mask RM2 is then stripped, and as a result a transfer of the target pattern SDS1 and the supplementary target pattern SDS2 is obtained such as to provide a patterning of the hard mask HM which corresponds to the desired combined pattern DL, as illustrated in FIG. 6C.

A final pattern transfer which can be part of the previous pattern transfer in an integrated etch chamber, is obtained by applying a third etching of the target layer TL.

In the present embodiment, the providing the resist-masks RM1 and RM2 may further include a variety of processes before and/or after exposure of the resist layer. For example, pre-exposure processes may include cleaning, priming, and soft bake processes. After exposure, the wafer substrates may be subjected to different post-exposure processes, such as, for example, a post exposure bake (PEB), and a hard bake. Further, any photoresist layer may include a Bottom Anti Reflex Coating or a Developable Bottom Anti Reflex Coating to reduce back reflection of exposure radiation.

A sixth embodiment of the invention is the same as the fifth embodiment safe for the developing of the resist layer RL1 after the first exposure, and the subsequent etching of the hard mask layer HM and stripping of the resist mask RM1. Instead, after the first exposure and before the second exposure, the resist layer RL1 is subjected to a post exposure bake and next the (substantially) unexposed portions of the resist layer RL1 are subjected to a supplementary, second exposure in accordance with the second exposure process of the previous embodiment. The post exposure bake has the effect of fixing the first target pattern SDS1 in the resist layer RL1, so that during the second exposure the resist has no "memory" of the first exposure. Non linear chemical properties of the resist are exploited for said fixing the pattern. Typically, positive tone resists for use with KrF excimer lasers and ArF excimer lasers are chemically amplified resists. A critical component of chemically amplified resist materials is the photo-acid generator (referred to as PAG), which is the photo-active ingredient. The resist further comprises a base B compound in a blocked matrix configuration. In this configuration, after exposure, photo-acid generator PAG is converted into a photo-acid PA+, of which some is neutralized by the base B compound.

During the baking process, a reaction is catalyzed between the photo-acid PA+ and the polymer so that, after baking, the polymer is deblocked, rendering it soluble in typical developer solutions, and the photo-acid PA+ is largely dissipated. For example, the photo-induced polymer deblocking reaction may cease, i.e. loses memory of the initial exposure, after approximately 40 seconds of baking time. Then, the chemical reactions occurring between the photo-acid PA+ and the polymer are reduced such that the extent of polymer deblocking does not increase with longer baking times. Thus, for this case, after a 40 sec. baking interval, the photo-acid PA+ virtually dissipates to provide a relatively high contrast and stable latent image corresponding to the pattern SDSl on a photoresist that further has little memory of the first (or any other any preceding) exposure.

Due to any non-linearity of the response of a photoresist layer to either development and/or exposure, the spatial Fourier transformation of the features of the resist-mask RM1 corresponding to the pattern SDS 1, contain higher spatial frequencies than the spatial Fourier transformation of the intensity pattern of the image of the mask-pattern MP1, as provided by the projection system of the lithographic apparatus. Similarly, the intensity pattern of the image of the mask-pattern MP2 contain lower spatial frequencies than the spatial Fourier transformation of the features of mask-pattern MP1. Further, a cross talk or a merging of the two sub-pattern images corresponding to the patterns SDS1 and SDS2 is prevented, in the above described double exposure embodiments, by either a transfer of the pattern SDS1 to the hard mask HM or by fixing the pattern DSD1 in the resist layer. Therefore, also the spatial Fourier transformation of the combined pattern DL as transferred to the hard mask HM contains spatial frequencies higher than corresponding to the inverse of a half pitch $P_{0.5}=k_1 \cdot \lambda/NA$ whereby the limitation $k_1 \geq 0.25$ is valid. The presence of said higher frequencies in principle enables the circumvention of the $k_1=0.25$ barrier.

According to an aspect of the present invention the fifth and sixth embodiment are not limited to the specific values chosen for the target duty cycles and the pattern duty cycles. For example, in analogy with the single exposure processes according the present invention, target duty cycles may have a value between 0.7 and 0.8, and pattern duty cycles may have a value between 0.2 and 0.55.

According to a further aspect of the invention, any of the embodiments described above is not limited to patterns comprising lines and spaces. The invention is generally applicable to printing features such as for example trenches arranged in semi dense patterns (using single exposure processes according to the present invention) and dense patterns of trenches (using double exposure processes according to the present invention).

According to a seventh embodiment of the invention a double exposure printing method uses two exposures as described in the fourth embodiment, whereby a further reduction of MEF down to a value of 2 is provided with each exposure. Thus, for the two exposures the respective pattern duty cycles PDC1 and PDC2 are given by PDC1=PDC2=0.25 (pattern lines of 25 nm and pattern spaces of 75 nm) and the respective target duty cycles TDC1 and TDC2 are given by TDC1=TDC2=0.5 (target pattern lines of 50 nm width and target pattern spaces of 50 nm with), so that BR1=BR2=0.67.

Further, the seventh embodiment differs only from the fifth embodiment in that the etching step between the two exposures and the etching step after the second exposure are each supplemented by applying a feature shrink process. The feature shrink step is arranged to reduce the width of the spaces of the patterns SDS1 and SDS 2 for example, down to 30 nm, enabling the interlaced positioning of the spaces, as described in the fifth embodiment. For example, a feature shrink can be arranged and obtained by applying an etch bias to a process of dry etching the hard mask layer HM. Alternatively, the shrinking is provided by applying a resist-processing to shrink the features of the resist masks RM1 and RM2. Resist process shrink techniques such as, for example, a chemical and a thermal resist processing for shrinking features can be used and have been shown to enable feature size correction of up to 50 nm shrink in a controlled way.

According to the present invention neither a deposition of a hard mask layer between the two exposures is not needed. Instead, the present exposure and line printing method in principle only uses a conventional aqueous development steps and dry etch steps. Consequently, the present method can easily be implemented in a lithographic system comprising the lithographic apparatus and a coat/develop track that is typically linked to the lithographic apparatus.

Figure 7:
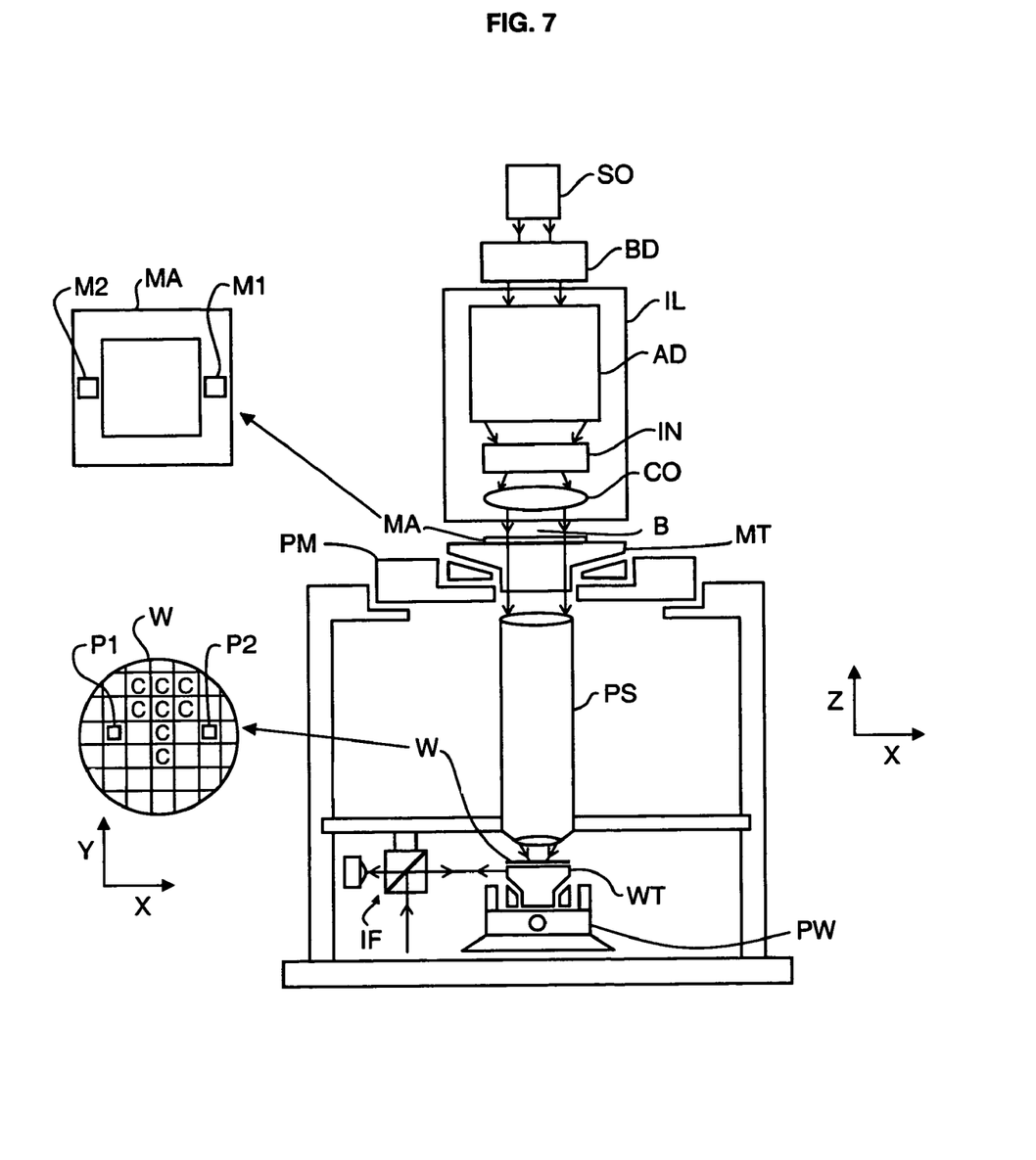
FIG. 7 illustrates a lithographic apparatus according to the invention.

A lithographic exposure apparatus according to an embodiment of the invention is schematically depicted in FIG. 7. The apparatus comprises:

an illumination system (illuminator) IL configured to condition a radiation beam B (e.g., UV radiation or DUV radiation such as for example generated by an excimer laser operating at a wavelength of 193 nm or 157 nm, or EUV radiation generated by a laser-fired plasma source operating at 13,6 nm).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit. The patterning device may be transmissive or reflective.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a reflective mask).

The lithographic apparatus may be of a type having two (dual stage) or more substrate tables (andlor two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion"as used herein does not mean that a structure, such as a substrate, must be submerged in liquid, but rather only means that liquid is located between the projection system and the substrate during exposure.

Referring to FIG. 7, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the parameters σouter and σinner, respectively, of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 7) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

According to an aspect of the invention the lithographic system comprises, as lithographic exposure apparatus, a lithographic interferometry apparatus. In such an apparatus, a resist layer is exposed to a fringe pattern obtained in a multiple beam interferometric apparatus. For example, two collimated beams of UV or DUV radiation intersect each other at an angle to produce linear interference fringes. A wafer having a photosensitive layer is positioned on a movable table. The table is arranged to be rotated and translated in two-dimensions respectively. Two substantially collimated coherent optical beams provided by any suitable well known source or sources are directed at a variable angle from the normal vector associated with the wafer toward each other and toward the photoresist layer to form an interference pattern on the photosensitive layer. The interfering radiation beams of coherent radiation may be generated by, for example, an ArF excimer laser using a beam splitting element, and may be provided in any suitable well known manner so that they are from the same source and are essentially equal in intensity at the wafer which assures a high contrast exposure.

The interference pattern produced on the photoresist layer or layers may be varied by for example rotating the wafer and/or translating the wafer.

A control device according to the present invention may comprise a memory into which data can be stored which concern the sub-patterns SDS1 and SDS2 and which are used for controlling the lithographic exposure apparatus (such as, for example, settings concerning positioning of the stages MT and WT, and/or settings concerning illumination modes) during each of the two exposures required to generate the combined pattern DL. The same memory can be used to store data concerning the settings bias-ratios BR1 and BR2. A computer which may be part of the control device is programmed and arranged to execute, based on the data stored in the memory, any of the method steps according to the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A method of patterning a positive tone resist layer overlaying at least partially a lithographic substrate with a target pattern of target pattern features and spaces having a target duty cycle of feature-width divided by pitch, comprising:
   providing a mask pattern of mask-pattern features and spaces in accordance with the target pattern using a patterning device, and having a mask-pattern duty cycle of feature-width divided by pitch;
   exposing the positive tone resist layer to a pattern of radiation using the mask pattern, wherein the patterning device and a projection system having a demagnification factor are traversed by the radiation and are constructed and arranged to provide said pattern of radiation;
   selecting a bias-ratio of mask-pattern feature-width multiplied by demagnification and divided by target-pattern feature-width at a value lower than 0.8; and
   arranging an exposure dose in accordance with the selected bias-ratio to provide the target duty cycle.

2. A method according to claim 1, wherein the target duty cycle has a value selected from the range of 0.7 to 0.8.

3. A method according to claim 2, wherein the mask-pattern duty cycle has a value selected from the range of 0.2 to 0.5.

4. A method according to claim 1, wherein the target duty cycle is 0.5+/−0.05 and the mask-pattern duty cycle is 0.25+/−0.05.

5. A method according to claim 1, wherein the features of the target-pattern are unexposed resist material features and the spaces of the target pattern are photo activated resist material features.

6. A method according to claim 1, further comprising:
   developing the positive tone resist layer;
   etching a hard mask layer underneath the positive tone resist layer to transfer the target pattern to the hard mask layer;
   providing a supplementary positive tone resist layer overlaying at least partially the hard mask layer; and
   patterning the supplementary resist layer with a supplementary target pattern of features and spaces by:
      providing a mask pattern for the supplementary resist layer;
      exposing the supplementary resist layer using the supplementary resist layer mask pattern;
      selecting a supplementary bias-ratio of supplementary resist layer mask-pattern feature-width multiplied by demagnification and divided by supplementary target-pattern feature-width; and
      arranging an exposure dose using the supplementary bias-ratio, and wherein the supplementary target pattern is disposed in interlaced position with respect to the target pattern.

7. A method according to claim 6, wherein the bias-ratio and the supplementary bias-ratio are substantially equal.

8. A method according to claim 6, wherein the supplementary bias-ratio is selected at a value lower than 0.8.

9. A method according to claim 1, further comprising:
applying a post exposure bake to the positive tone resist layer to transfer the target pattern to the positive tone resist layer; and
patterning unexposed portions of the positive tone resist layer with an unexposed portions target pattern of features and spaces by:
providing a mask pattern for the unexposed portions;
exposing the unexposed portions of the resist layer using the unexposed portions mask pattern;
selecting an unexposed portions bias-ratio of unexposed portions mask-pattern feature-width multiplied by demagnification and divided by unexposed portions target-pattern feature-width; and
arranging an exposure dose using the unexposed portions bias-ratio, and wherein the unexposed portions target pattern is disposed in interlaced position with respect to the target pattern.

10. A method according to claim 9, wherein the bias-ratio and the unexposed portions bias-ratio are substantially equal.

11. A method according to claim 9, wherein the unexposed portions bias-ratio is selected at a value lower than 0.8.

12. A method according to claim 1, the method further comprising:
developing the positive tone resist layer;
etching a hard mask layer underneath the positive tone resist layer to transfer the target pattern to the hard mask layer;
providing a supplementary positive tone resist layer overlaying at least partially the hard mask layer; and
patterning the supplementary resist layer with a supplementary target pattern of features and spaces by:
providing a mask pattern for the supplementary resist layer;
exposing the supplementary resist layer using the supplementary resist layer mask pattern;
selecting a supplementary bias-ratio of supplementary resist layer mask-pattern feature-width multiplied by demagnification and divided by supplementary target-pattern feature-width; and
arranging an exposure dose using the supplementary bias-ratio, and wherein the spaces of the supplementary target pattern are disposed in interlaced position with respect to the spaces of the target pattern.

13. A method according to claim 1, further including:
applying a post exposure bake to the positive tone resist layer to transfer the target pattern to the positive tone resist layer; and
patterning unexposed portions of the positive tone resist layer with an unexposed portions target pattern of features and spaces by:
providing a mask pattern for the unexposed portions;
exposing the unexposed portions of the resist layer using the unexposed portions mask pattern;
selecting an unexposed portions bias-ratio of unexposed portions mask-pattern feature-width multiplied by demagnification and divided by unexposed portions target-pattern feature-width; and
arranging an exposure dose using the unexposed portions bias-ratio, and wherein the spaces of the unexposed portions target pattern are disposed in interlaced position with respect to the spaces of the target pattern.

14. A method according to claim 1, further including:
developing the positive tone resist layer;
applying a resist feature shrink process to features of the developed positive tone resist layer;
etching a hard mask layer underneath the positive tone resist layer to transfer the target pattern to the hard mask layer;
providing a supplementary positive tone resist layer overlaying at least partially the hard mask layer; and
patterning the supplementary resist layer with a supplementary target pattern of features and spaces by:
providing a mask pattern for the supplementary resist layer;
exposing the supplementary resist layer using the supplementary resist layer mask pattern;
selecting a supplementary bias-ratio of supplementary resist layer mask-pattern feature-width multiplied by demagnification and divided by supplementary target-pattern feature-width; and
arranging an exposure dose using the supplementary bias-ratio, and wherein the supplementary target pattern is disposed in interlaced position with respect to the target pattern;
developing the supplementary resist layer;
applying a resist feature shrink process to features of the developed supplementary resist layer; and
etching the hard mask layer.

15. A method according to claim 1, further including:
developing the positive tone resist layer;
etching a hard mask layer underneath the positive tone resist layer to transfer the target pattern to the hard mask layer to form etched features having a feature size, wherein an etch bias is applied to shrink the feature size of the etched features with respect to a corresponding positive tone resist layer feature size;
providing a supplementary positive tone resist layer overlaying at least partially the hard mask layer; and
patterning the supplementary resist layer with a supplementary target pattern of features and spaces by:
providing a mask pattern for the supplementary resist layer;
exposing the supplementary resist layer using the supplementary resist layer mask pattern;
selecting a supplementary bias-ratio of supplementary resist layer mask-pattern feature-width multiplied by demagnification and divided by supplementary target-pattern feature-width; and
arranging an exposure dose using the supplementary bias-ratio, and wherein the supplementary target pattern is disposed in interlaced position with respect to the target pattern;
developing the supplementary resist layer;
etching the hard mask layer to form supplementary etched features having a feature size, wherein an etch bias is applied to shrink the feature size of the supplementary etched features with respect to a corresponding supplementary resist layer feature size.

16. A method according to claim 1, wherein the features are lines.

17. A method for patterning a positive tone resist layer overlaying at least partially a lithographic substrate with a target pattern of target pattern features and spaces having a target duty cycle of feature-width divided by pitch, the patterning using a mask pattern of mask-pattern features and spaces in accordance with the target pattern and having a mask-pattern duty cycle of feature-width divided by pitch, the method comprising:
selecting a bias-ratio of mask-pattern feature-width multiplied by a demagnification factor used in projecting a beam of radiation patterned using the mask pattern to the substrate and divided by target-pattern feature-width at a value lower than 0.8; and arranging an exposure dose to expose the positive tone resist layer using the mask pattern, the exposure dose arranged in accordance with the selected bias-ratio to provide the target duty cycle.

18. A method according to claim 17, wherein the target duty cycle has a value selected from the range of 0.7 to 0.8.

19. A method according to claim 18, wherein the mask-pattern duty cycle has a value selected from the range of 0.2 to 0.5.

20. A method according to claim 17, wherein the target duty cycle is 0.5+/−0.05 and the mask-pattern duty cycle is 0.25+/−0.05.

* * * * *